United States Patent
Laulanet et al.

(10) Patent No.: US 7,315,187 B2
(45) Date of Patent: Jan. 1, 2008

(54) COMPARATOR FOR INPUT VOLTAGES HIGHER THAN SUPPLY VOLTAGE

(75) Inventors: Francois Laulanet, Neder-Over-Heembeek (BE); Bernard Gentinne, Brussels (BE)

(73) Assignee: AMI Semiconductor Belgium BVBA, Oudenaarde (BE)

(*) Notice: Subject to any disclaimer, the term of this patent is extended or adjusted under 35 U.S.C. 154(b) by 57 days.

(21) Appl. No.: 11/282,574

(22) Filed: Nov. 21, 2005

(65) Prior Publication Data

US 2006/0125529 A1    Jun. 15, 2006

(30) Foreign Application Priority Data

Nov. 22, 2004    (EP)    ................... 04078179

(51) Int. Cl.
*H03K 5/22*    (2006.01)
(52) U.S. Cl. .......................................... 327/66; 327/65
(58) Field of Classification Search ................. 327/65, 327/66
See application file for complete search history.

(56) References Cited

U.S. PATENT DOCUMENTS

| | | | |
|---|---|---|---|
| 5,302,902 A | 4/1994 | Groehl | |
| 5,942,921 A | 8/1999 | Talaga, Jr. | |
| 6,008,674 A | 12/1999 | Wada et al. | |
| 6,031,397 A | 2/2000 | Banba | |
| 6,133,764 A * | 10/2000 | Griffith et al. | 327/65 |
| 6,304,088 B1 | 10/2001 | Yee | |
| 6,411,133 B1 | 6/2002 | Matsudai et al. | |
| 6,639,452 B2 * | 10/2003 | Ono et al. | 327/541 |
| 6,747,486 B2 * | 6/2004 | Horn | 327/63 |
| 6,812,747 B2 | 11/2004 | Ganivet et al. | |

FOREIGN PATENT DOCUMENTS

FR    2 838 840    10/2003

* cited by examiner

Primary Examiner—Kenneth B. Wells
Assistant Examiner—Ryan C. Jager
(74) Attorney, Agent, or Firm—Bacon & Thomas, PLLC

(57) ABSTRACT

A comparator has first and second current paths, each passing from an input through a transistor, through a current source to ground, the second current path also having a reference voltage drop element coupled in series with the second input. The gates of the transistors are coupled to form a current mirror. The reference voltage drop element enables higher voltages to be input and compared to higher thresholds above an internal supply voltage level without the need for dividing resistors to reduce the input voltage. Avoiding such resistors means the power dissipation and the silicon area used can be kept lower. ESD vulnerability is reduced since the inputs are not coupled to gates of MOS transistors. Overvoltage protection across the source and gate of the second transistor can be added.

11 Claims, 6 Drawing Sheets

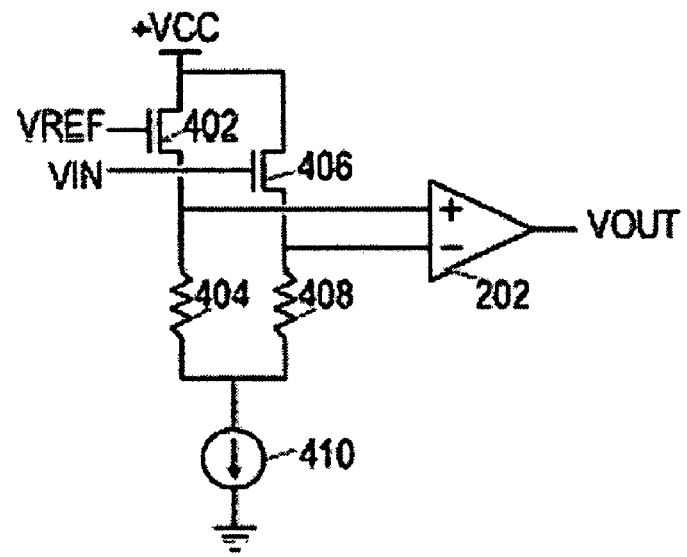
FIG. 1 – PRIOR ART
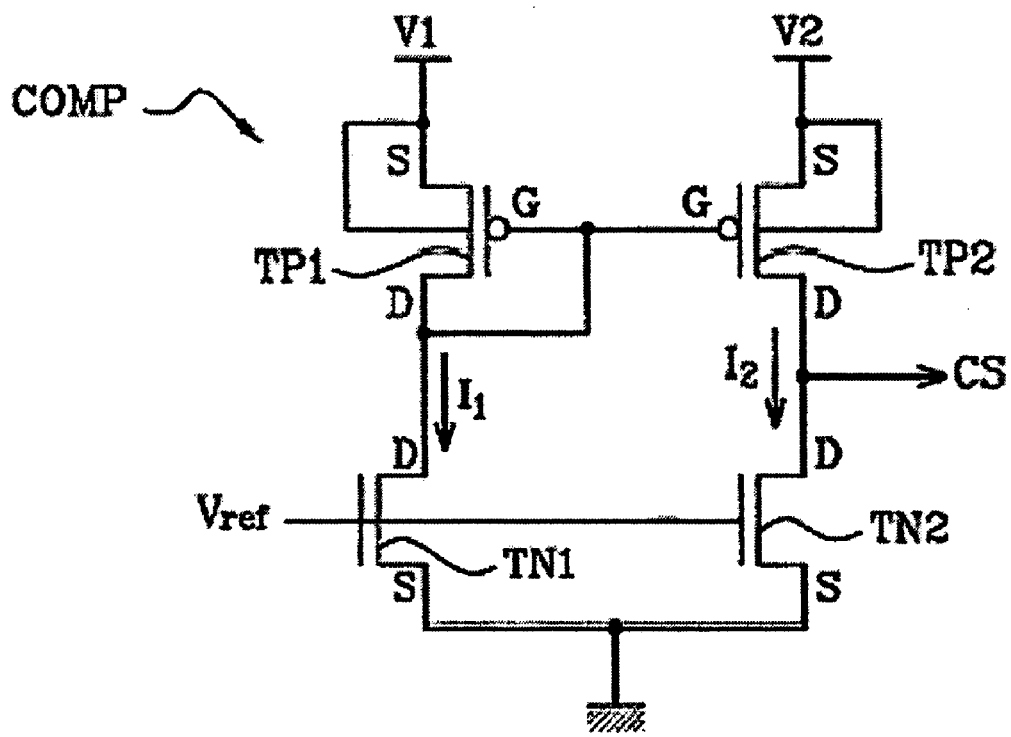
FIG. 2 – PRIOR ART

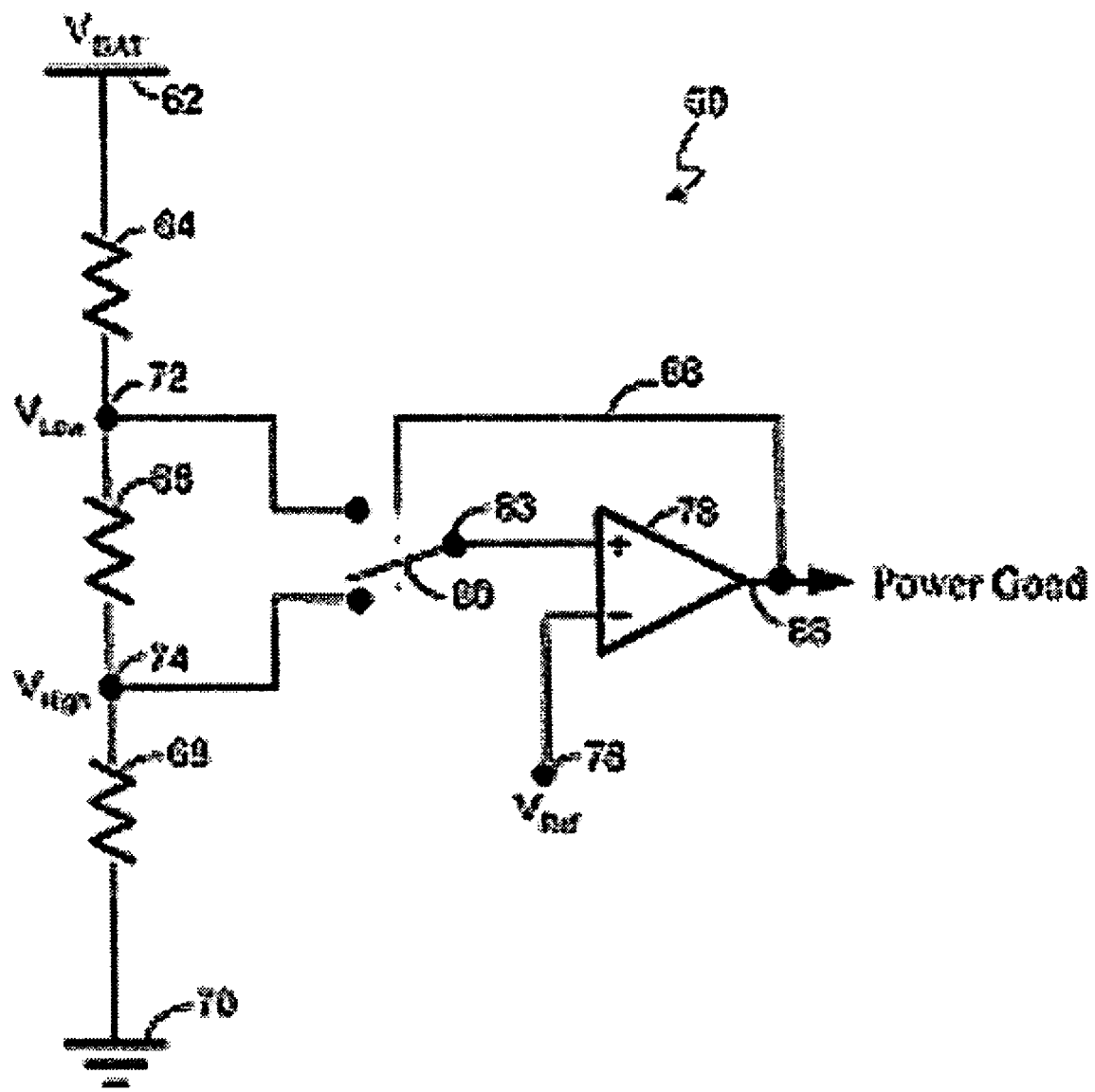
FIG. 3 – PRIOR ART

COMPARATOR FOR INPUT VOLTAGES HIGHER THAN SUPPLY VOLTAGE

FIELD OF THE INVENTION

This invention relates to comparators, and to integrated circuits having such comparators, and to devices having such integrated circuits as well as to methods of operating and making these.

DESCRIPTION OF THE RELATED ART

It is known to try to reduce power supply voltages for integrated circuits to reduce power consumption and to allow for increased integrated circuit densities. However, this may result in systems having integrated circuits using digital components powered by different supply voltages, which can cause interfacing problems. For example, transistors in the reduced voltage circuit may be subject to failure if forced to sustain the larger power supply voltage. If these transistors are protected with limiting diodes, this may prevent the transistors from detecting the desired signals, particularly in the case of differential signalling. Circuits such as comparators and differential amplifiers can use differential inputs. U.S. Pat. No. 5,942,921 is concerned with this issue and shows a solution for interfacing low voltage circuitry to high voltage circuitry, and in particular, to an interface circuit which operates from the low voltage power supply to detect differential signals which may have signal voltages that exceed the voltage of the low power supply. A first transistor and a first resistor coupled in series are coupled in parallel with a second transistor and a second series resistor. The transistor drain terminals are both coupled to the power supply voltage, and a current source draws current from the common node of the resistors. Input voltages are supplied to the gates of the transistors, and the differential output voltages are provided from the transistor source terminals. A differential amplifier receives the differential output voltages and provides a single output voltage. The differential buffer transistors are exposed to only the differences between the input voltages and the power supply voltage, and consequently may not be subject to failure if the input voltage exceeds the power supply voltage. Further, the current carrying capacity of the transistors is modulated by the input voltages regardless of whether the input voltages exceed the supply voltages or not, thereby allowing differential detection even with signal voltages that exceed the power supply voltage.

It is also known from French patent publication FR 2 838 840 that comparing a supply voltage with a determined voltage cannot be carried out with a conventional comparator having two inputs and one power supply input since the differential stages of the comparator cannot be biased by the same voltage as one of the voltages to be compared. The solution proposed in this case involves the comparator having first and second PMOS transistors arranged as current mirrors, as shown schematically in FIG. 2 described in more detail below. The first PMOS transistor has its source connected to the first input of the comparator for receiving the first voltage. The second PMOS transistor has its source connected to the second input of the comparator for receiving the second voltage. The output of the comparator is connected to the drain of one of the transistors. This is useful in specific applications such as control of a charge pump involving compare an internal supply voltage level and an external supply voltage, to determine when the external supply drops below a threshold.

For other applications of comparators where signals to be compared are both higher than the internal supply voltage, it is known to use resistive dividers/level shifters to reduce the voltages input to the comparator to a level below the internal supply voltage level, and the inputs can be fed to gates of the transistors of the comparator. U.S. Pat. No. 5,302,902 shows an example where level sensing uses such resistive scaling. U.S. Pat. No. 6,304,088 shows another example in which monitoring of the voltage $V_{BAT}$ requires a resistive divider too. This is described in more detail below with reference to FIG. 3

To limit the current dissipated in such resistive dividers, the value of the resistance should be high. This is useful for thermal management of products as well as battery life of mobile products. However this often conflicts or is incompatible with using only a small area of silicon to reduce costs and increase integration levels.

SUMMARY OF THE INVENTION

An object of the invention is to provide improved apparatus or methods, especially comparators, and integrated circuits having such comparators, and devices having such integrated circuits as well as methods of operating and making these.

According to a first aspect, the invention provides a comparator for comparing voltages of first and second inputs, and having first and second current paths coupled to the first and second inputs respectively, the first current path passing from the first input through a first main electrode such as a source and second main electrode, e.g. a drain of a first transistor, and through a first bias current source to a supply line, the second current path passing through a reference voltage drop element, through a first main electrode, e.g. a source and a second main electrode, e.g. a drain of a second transistor, and through a second bias current source to a supply line. The reference voltage drop element may comprise at least one of a transistor, a diode or a battery. The comparator may be implemented in CMOS or BiCMOS technology, for example and less preferred in bipolar technology. The first and second transistors (M1 and M2) are preferably MOS transistors.

The comparator is implemented with a current mirror arrangement, but the additional reference voltage drop element enables higher voltages to be input and compared to an internal supply voltage level without the need for resistive dividers. The higher thresholds could be achieved by combining the conventional technique of a differential amplifier arrangement with the conventional voltage dropping resistive dividers on one or both inputs, but at a cost of higher power dissipation, i.e. due to the limitation imposed on the size of integrated resistors. The advantages are based on a recognition that the power dissipation of the comparator is determined by the biasing current sources only, and the area of semiconductor, e.g. silicon used by current sources is usually smaller than the area used by resistors of sufficient resistance to limit the current at the level imposed by these current sources. An additional advantage is that the inputs of the comparator are not connected to control electrodes of transistors, e.g. gates of MOS transistors, which should improve the resistance of the component to ESD. Hence the power dissipation and or the semiconductor, e.g. silicon area used can be kept lower than known arrangements using dividing resistors.

The reference voltage drop element can include a resistance (less preferred), and or one or more diode drops or other circuitry. In particular, the reference voltage drop can be embodied by, for example, any one or any combination of the following:

a diode or diodes in series. The diodes are forward biased but the use of reverse biased diodes is included, e.g. for very low currents, such as for use in the femto to nanoampere range. The advantages of diodes are their robustness and small size. This achieves one of the goals of the present invention, e.g. together with low power dissipation.

diode connected transistors, e.g. MOS transistors with their gate connected to their drain electrode. For a given voltage drop at a given current level, transistors (and diode) will be smaller than resistors.

a resistor is a less preferred solution since it will always occupy more silicon area than a series of diodes or diode connected transistor for a given current and a given voltage drop.

a battery, e.g. discrete, is a less a preferred solution. Typically, a battery cannot be integrated on chip in standard technologies. However the present invention includes within its scope the use of batteries, e.g. integration of batteries on-chip in future technologies. For instance Zn/Air batteries can already be printed on paper.

An additional feature of the present invention is the first and second transistors, e.g. transistors M1 and M2, being PMOS transistors.

Another such feature is the control electrodes, e.g. gates of the first and second transistors being coupled together. Another such feature is the second main electrodes, e.g. drains of the first and second transistors, being coupled to the first and second current sources respectively. The first input is fed to the first main electrode, e.g. source of the first transistor. The second input is applied to one of the electrodes of the voltage drop element. Another such feature is the control electrode, e.g. gate and the second main electrode, e.g. drain of the first transistor being coupled together.

Another such feature is the voltage drop element comprising one or more transistors. Another such feature is an output being taken from a second main electrode, e.g. drain of the second transistor.

Another such feature is a third transistor in the first current path and coupled to the second main electrode, e.g. drain of the first transistor. The third transistor is connected between the first transistor and the current source in the first current path to limit the voltage at the positive electrode of the current source. A fourth transistor can be included in the second current path and coupled to a second main electrode, e.g. drain of the second transistor and the current source in the second current path to limit overvoltage at the positive electrode of the current source. Another such feature is circuitry coupled between the first main electrode, e.g. source, and a control electrode, e.g. gate of the second transistor to limit overvoltage. This is useful for enabling implementation in technologies vulnerable to such overvoltage. Another such feature is a diode coupled to the first input to protect the first input from current flow through forward biasing of a parasitic diode from drain to bulk of the first transistor.

Another aspect of the invention provides an integrated circuit having the comparator. Another aspect provides a battery powered mobile device having the integrated circuit. This is based on a recognition that the advantages of the integrated circuit can feed through to such devices to improve the device performance.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the claims of the present invention.

BRIEF DESCRIPTION OF THE DRAWINGS

How the present invention may be put into effect will now be described by way of example with reference to the appended drawings, in which:

FIGS. 1 to 3 show known arrangements,

DESCRIPTION OF THE PREFERRED EMBODIMENTS

Figure 4:
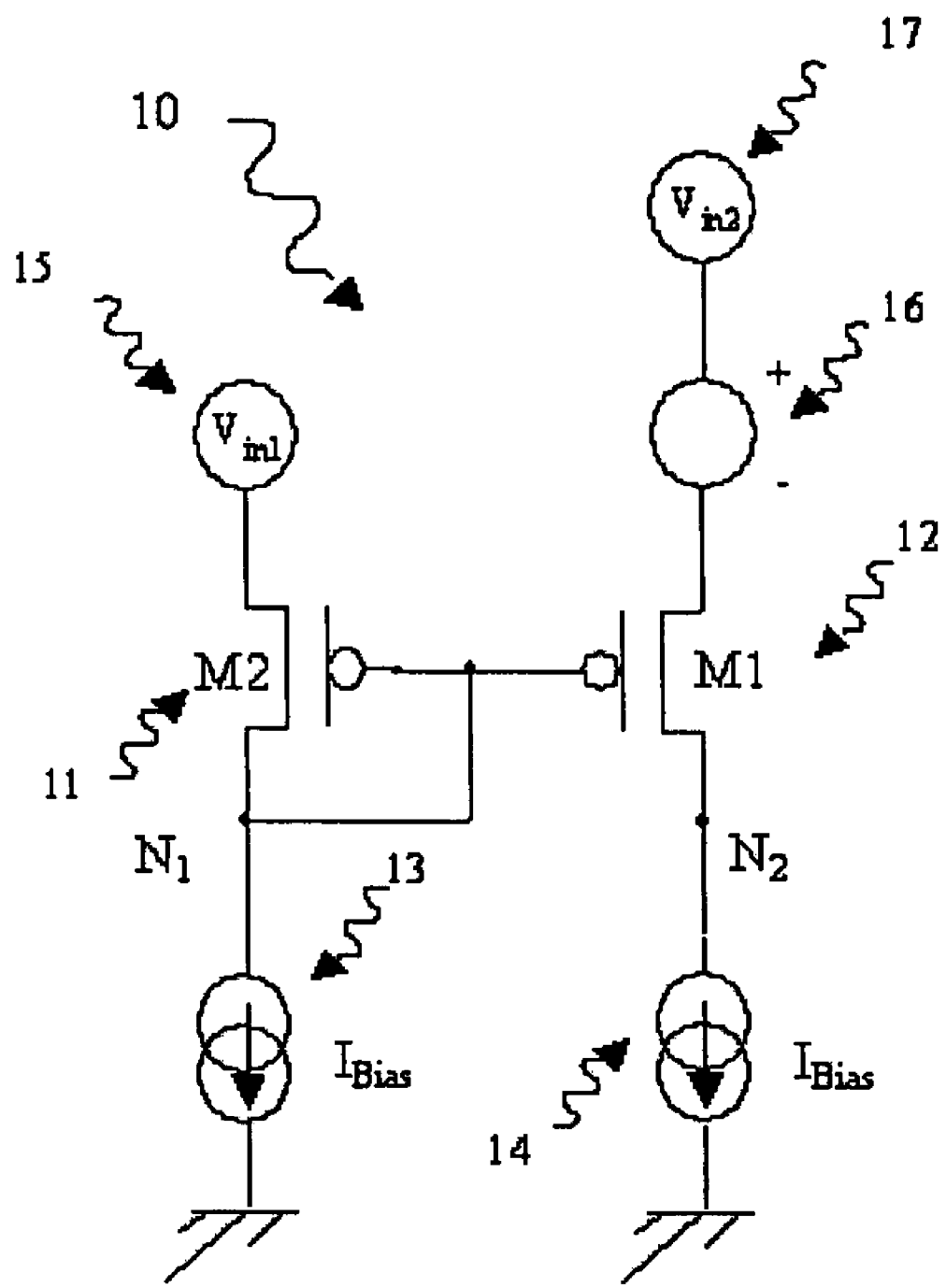
FIG. 4 shows a schematic view of a comparator according to a first embodiment of the invention.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

It is furthermore to be noticed that the term "comprising", used in the description and in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Reference will be made to transistors. These are three-terminal devices: a first main electrode such as a source, a second main electrode such as a drain and a control electrode such as a gate for controlling the follow of electrical charges between the first and second main electrodes.

For reference, before describing the embodiments, known arrangements will be described briefly. FIG. 1 shows a circuit known from U.S. Pat. No. 5,942,921. This includes a differential buffer for a differential amplifier 202. The differential buffer includes a transistor 402 in series with a resistance 404, coupled in parallel with a second transistor 406 matched to the first transistor 402 and a second resistance 408 equal to the first resistance 404. The common node shared by transistors 402 and 406 is coupled to the supply voltage, and the common node shared by the resistances 404 and 408 is connected to ground via a current source 410. The input voltages are provided to the gates of the transistors 402 and 406, and the output voltages are provided to the differential amplifier inputs from the transistor source terminals. The differential buffer protects the differential amplifier from excess input signal voltages. The differential buffer transistors can be driven by input voltage signals up to twice the power supply voltage, and the differential configuration of the buffer provides continued differential signal detection at voltages above the power supply voltage. The current source 410 and the resistances 404 and 408 are chosen so that as long as the difference between the input signal voltages is greater than a few millivolts, the output voltage difference saturates at approximately the power supply voltage. The uniform voltage swing at the input to the differential amplifier 202 then provides for a fixed propagation delay, thereby eliminating sensitivity of the output voltage to the size of input voltage swings.

FIG. 2 shows a circuit from FR 2 838 840. The comparator is provided to compare an input voltage V1 and an input voltage V2, and to deliver an output signal CS set to 1 when one of the voltages is higher than the other, or set to 0 in the opposite case. The comparator COMP comprises two PMOS transistors TP1, TP2 having their gates G interconnected. The source S of the transistor TP1 forms the first input of the comparator and receives the voltage V1. The source S of the transistor TP2 forms the second input of the comparator and receives the voltage V2. The bulk of the transistor TP1 is taken to the source potential of the transistor, and therefore receives the voltage V1. The bulk of the transistor TP2 is also taken to the source potential of the transistor, and therefore receives the voltage V2. The output of the comparator, which delivers the signal CS, is connected to the drain of the transistor TP2. The transistors TP1, TP2 are in two branches arranged as current mirrors. The first branch comprises the transistor TP1 in series with a transistor TN1, and the second branch comprises the transistor TP2 in series with a transistor TN2. The transistor TP1 has its gate G connected to its drain D, which is connected to the drain D of the transistor TN1. The drain of the transistor TP2 is connected to the drain of the transistor TN2. The sources of the transistors TN1, TN2 are linked to ground, and the gates of the transistors TN1 and TN2 are biased by a voltage Vref(I). The voltage Vref(I) is delivered by a reference voltage generator, not represented here. The voltage Vref(I) is substantially equal to the threshold voltage of the transistors TN1, TN2 such that the latter operate in a saturated mode and are, as a result, equivalent to current sources.

The comparator COMP operates as a differential amplifier comparing the source voltages of the transistors TP1 and TP2, i.e., the voltages V1 and V2. When the voltage V2 is lower than the voltage V1, i.e., V2=V1−e wherein e is a non-zero quantity, then the gate voltage of the transistor TP2 is equal to V1−Vt, since it is imposed by the transistor TP1 that is on. Vt is the threshold voltage of the transistors TP1, TP2. The source-gate voltage Vsg of the transistor TP2 is therefore equal to:

$Vsg=(V1-e)-(V1-Vt)=Vt-e$ and is therefore substantially lower than Vt, such that the transistor TP2 is blocked. As the transistor TN2 is on, the signal CS changes to 0 (ground). Conversely, if input voltage V2 is higher than input voltage V1, V1+e for example, the source-gate voltage Vsg of the transistor TP2 is higher than its threshold voltage Vt:

$Vsg=V1+e-(V1-Vt)=Vt+e$

Transistor TP2 is on and delivers a greater current than the transistor TP1. Since the drain currents of transistors TN1 and TN2 are assumed to be identical, the output signal CS rises and becomes equal to the voltage V2, i.e., the logic level 1. In summary, the transistor TP2 is blocked and the output CS is 0 when the voltage V2 is lower than V1. The transistor TP2 is on and the output CS is 1 when the voltage V2 is higher than V1. There is no suggestion here of how to enable the input voltages to be much greater than the supply voltage.

FIG. 3 shows another voltage monitor circuit 60 known from U.S. Pat. No. 6,304,088. It can be used to monitor any voltage and provide an output signal indicative of the value or a status of the voltage being monitored. A resistor network of three resistors is employed to scale the battery voltage to provide the desired high and low monitor voltage levels. The resistance of each of resistors 64, 66, and 68 is selected in the known ways to implement a desired amount of hysteresis in voltage monitor circuit 60. Resistance values for resistors 64, 66, and 68 are selected to set the desired threshold voltages $V_T$ (Low) and $V_T$ (High) for the monitor circuit. In fact, the resistance values for resistors 64, 66, and 68 are chosen so that when $V_{BAT}$ equals $V_T$ (High), monitor voltage $V_{High}$ equals a reference voltage $V_{Ref}$, and when $V_{BAT}$ equals $V_T$ (Low), monitor voltage $V_{Low}$ equals the same reference voltage $V_{Ref}$. Switch 80 of voltage monitor circuit 60 is a single pole-double throw switch. Switch 80 has a first position connecting its output terminal 83 to a voltage terminal coupled to node 72, which is the low voltage monitor level $V_{Low}$. Switch 80 has a second position connecting its output terminal 83 to another voltage terminal coupled to node 74, which is the high voltage monitor level $V_{High}$. Switch output terminal 83 is coupled to a non-inverting input terminal of comparator 78. Reference voltage $V_{Ref}$ is coupled to an inverting input terminal (node 76) of comparator 78. Comparator 78 generates an output signal "Power Good" on output lead 88 which is also coupled to a switch control terminal 86 of switch 80. When signal Power Good is at a low logic level, switch 80 is in the second position, connecting switch output terminal 83 to node 74. When signal Power Good is at a high logic level, switch 80 is in the first position, connecting switch output terminal 83 to node 72. In operation, Signal Power Good provides an indication of the status of the battery charge or the battery voltage to be monitored.

In state of the art components, the designer's goal is to synthesize a given function with the minimum transistor count/the lowest silicon area (cost of silicon) and the minimum power dissipation (power budget). The latter is often incompatible with a low area of semiconductor, e.g. silicon. To enable input voltages higher than the supply voltage to be used, and achieve a better balance between power dissipation and silicon area, than can be achieved using dividing resistors, the arrangement of the first embodiment of the invention shown in FIG. 4 is provided. This shows a voltage comparator 10 having two inputs 15, 17, and comprising transistors M1 (12) and M2 (11), two biasing current sources 13, 14 and an element 16 for generating a reference voltage drop, further referred to as reference voltage drop element 16. A "reference" input voltage $V_{in1}$ provided at the first input 15 is connected to a first main electrode, e.g. the source of transistor M2 (11), the first electrode of the element (16) generating a voltage drop being connected to the first main electrode, e.g. source of transistor M1 (12) while its second electrode is connected to a second input voltage $V_{in2}$ provided at the second input 17. The arrangement has two principal current paths, one from the first input 15 through the first main electrode, e.g. source, and the second main electrode, e.g. drain, of transistor M2 (11) and through current source 13 to ground. A second current path passes from the second input 17 though the reference voltage drop element 16, through the first main electrode, e.g. source, and the second main electrode, e.g. drain, of transistor M1 (12), and through the second current source 14 to ground.

Figure 6:
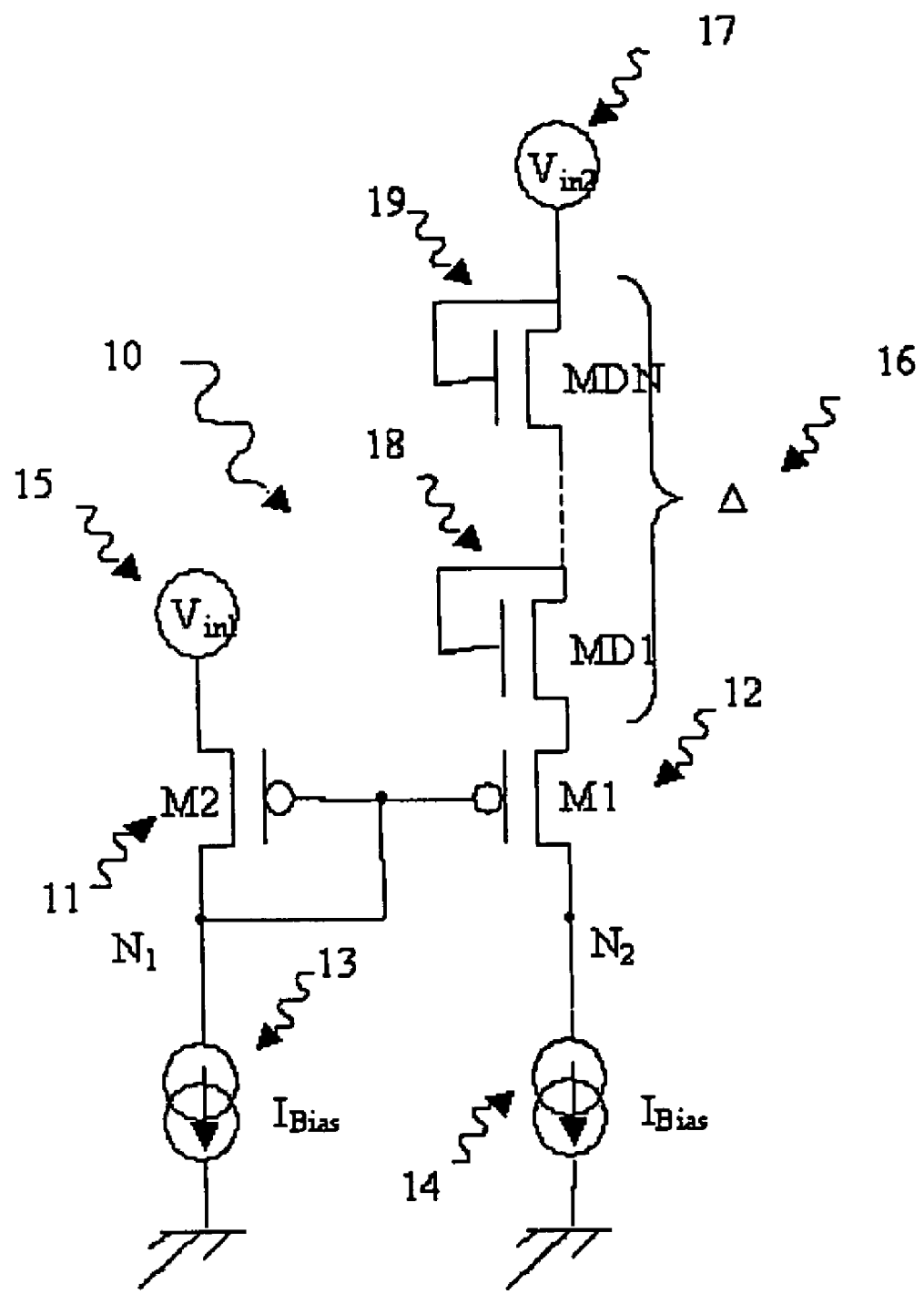
FIGS. 6 and 7 show schematic views of further embodiments including alternative reference voltage drop means.
Figure 7:
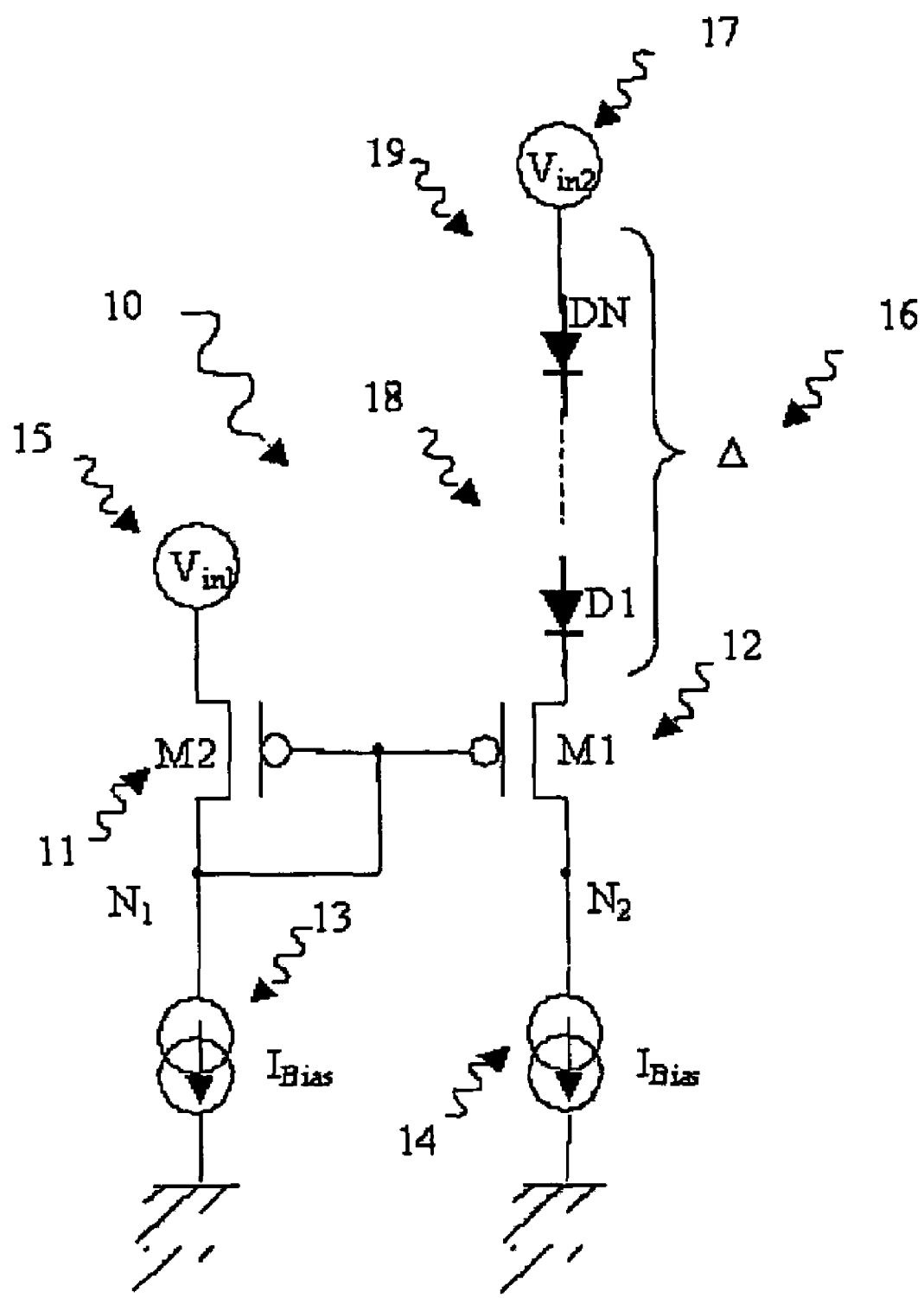

The reference voltage drop can be embodied by, for example, any one of the following or any combination of the following:

diode(s) in series—see FIG. 7. The diodes are forward biased but the use of reverse biased diodes for very low currents is not excluded, e.g. femto to nanoampere range. The advantages of diodes are their robustness and small size. This achieves is one of the goals of the present invention, e.g. together with low power dissipation.

diode connected transistors, e.g. MOS transistors, with their gate connected to their drain electrode—see FIG. 6. For a given voltage drop at a given current level, transistors (and diode) will be smaller than resistors.

A resistor is a less preferred solution since it will always occupy more silicon area than a series of diodes or diode connected transistor for a given current and a given voltage drop.

a battery, e.g. discrete, is a less a preferred solution. Typically, a battery cannot be integrated on chip in standard technologies. However the present invention includes within its scope the use of batteries, e.g. integration of batteries on-chip in future technologies. For instance Zn/Air batteries can already be printed on paper.

The control electrodes, e.g. gates of transistor M1 (12) and M2 (11) are connected together. The control electrode, e.g. gate of transistor M2 (11) is connected to the second main electrode, e.g. drain of the same transistor M2 (11). As long as the voltage $V_{in2}$ is sufficiently high, the voltage at node N2 is close to $V_{in1}-|VT|$, where VT is the threshold voltage of the transistors 11, 12, e.g. pMOS transistors M1 (12) and M2 (11). When the voltage $V_{in2}$ drops below $V_{in1}+\Delta V+|VT|$, the voltage at node N2 drops to ground. $\Delta V$ is dimensioned so as to take the current mismatch between first and second current path—whether accidental or purposeful—into account. This can be used as the output of the comparator. $\Delta V$, the voltage across the reference voltage drop element 16, determines the threshold level at which the transition occurs, relative to the first input 15. This enables the threshold to be set well above the supply voltage of circuitry following the comparator 10. The first input can use a fixed reference, if the threshold is to be fixed. Or the first input can be variable and the comparator 10 used to detect when the second input 17 exceeds the first input 15 by a predetermined voltage. This arrangement including the reference voltage drop element 16 can enable the total current used for this comparator 10 to be limited to a fraction of a μA for voltages in the range 12 to 24 volts for VCC=$V_{in1}$ and $V_{in2}$ respectively, depending upon transistor technology used, e.g. MOS transistors. The transistors M1 (12) and M2 (11) can be identical, i.e., having the same W/L ratio (gate width to length ratio), and the current sources 13, 14 can be arranged to provide the same current, to ensure the same current is present in each of the two current paths. Alternatively the transistors 11, 12 and the current sources 13, 14 can be arranged so that the currents in the two current paths differ by a predetermined amount. Of course other similar or equivalent circuits can be conceived using NMOS transistors, or using negative voltage supply levels and current flows in reverse to the embodiment shown and so on. Alternatively, BiCMOS transistors can be used. Circuits in accordance with the present invention can also be realized using exclusively bipolar transistors. However, this can be at the cost of increased power dissipation which is not a preferred embodiment of the present invention. The current sources 13, 14 can be implemented using conventional techniques. The reference voltage drop element 16 can be implemented using a resistor and more preferably one or more diode drops or other transistor circuitry following established techniques.

Figure 5:
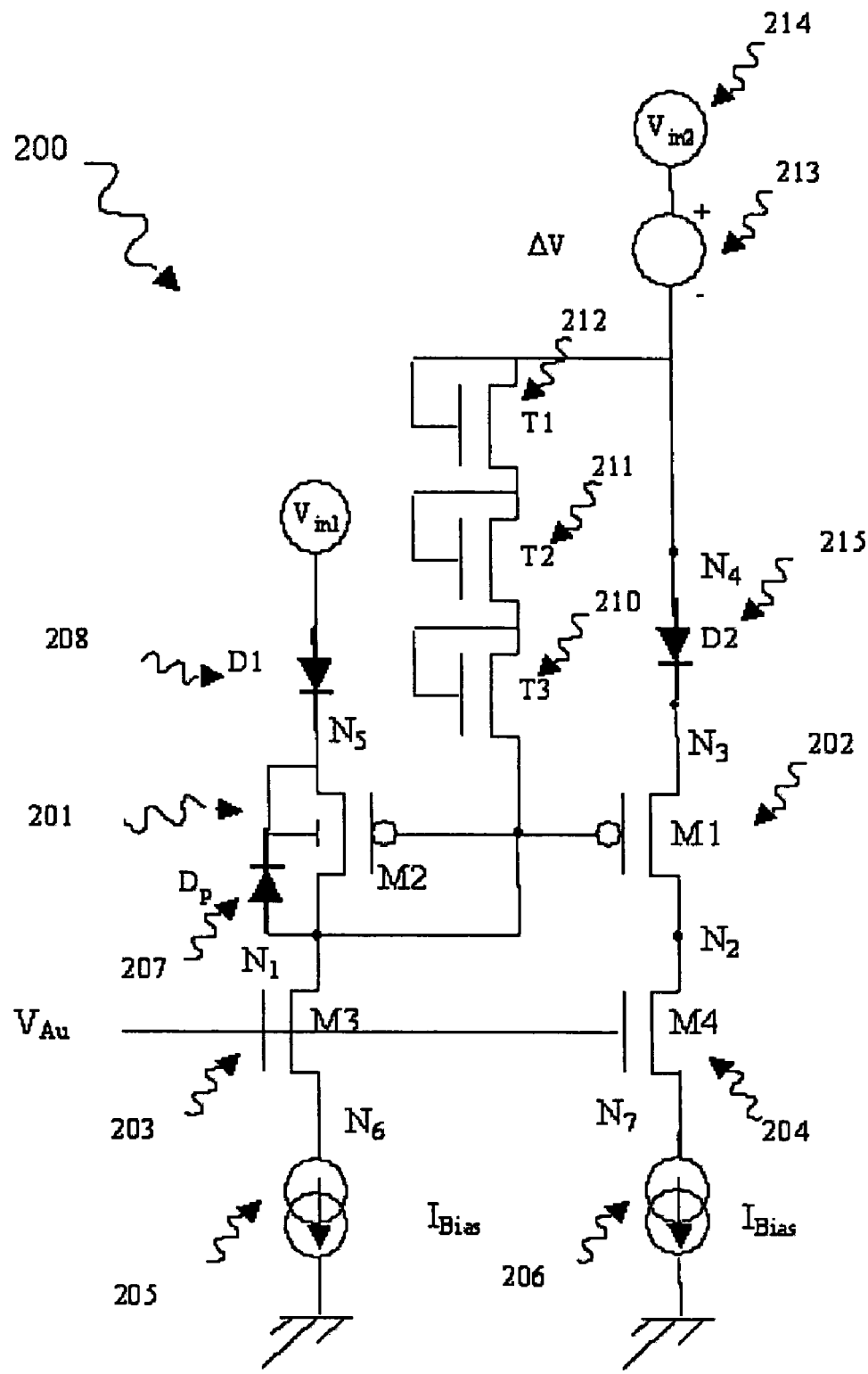
FIG. 5 shows a schematic view of a second embodiment.

To implement the invention in technologies where it is crucial to limit the voltage between the control electrode, e.g. gate and the first main electrode, e.g. source of a transistor, some precautions are useful as shown in the embodiment shown in FIG. 5. This shows a voltage monitoring/comparator circuit 200. The high-voltage transistors M3 (203) and M4 (204) biased with $V_{aux}$, limit the voltage at nodes $N_6$ and $N_7$. In order to limit the potential difference between the control electrode, e.g. gate and the first main electrode, e.g. source of (high-voltage) transistor M1 (202), a series of transistors 210, 211 and 212 connected in diode can be used. The number N (where N>=1) of these transistors T1 to TN required is a function of the threshold voltage of these transistors 210, 211, 212 and the maximum gate to source voltage that the PMOS can tolerate. A rule of thumb is N>=VGS max/$V_{threshold}$. Because of these transistors (T1 to TN)), the voltage at node $N_1$ may rise above the voltage at node $N_5$: the parasitic diode $D_p$ (207) (between second main electrode, e.g. drain and bulk of transistor M2 201) is then forward biased and a short-circuit occurs. The diode D1(208) will prevent this: should the voltage at node $N_1$ rise above $V_{in1}$, D1 is backward biased and no current flows through it. The diode D2 (215) is used to compensate for the offset introduced by D1 (one diode voltage drop). The output of the comparator is now node 7, that can be connected to the input of a (low voltage) Schmitt trigger.

As has been described above, a comparator has first and second current paths, each passing from an input 15, 17 through a transistor (M1, M2), through a current source 13, 14 to ground, the second current path also having a reference voltage drop element 16 coupled in series with the second input 17. The gates of the transistors 11, 12 are coupled to form a current mirror. The reference voltage drop element 16 enables higher voltages to be input and compared to higher thresholds above an internal supply voltage level without the need for dividing resistors to reduce the input voltage. Avoiding such resistors means the power dissipation and the silicon area used can be kept lower. ESD vulnerability is reduced since the inputs are not coupled to gates of MOS transistors. Overvoltage protection across the source and gate of the second transistor can be added.

Other variations can be conceived within the scope of the claims. For example, the transistors may be implemented in other technologies such as MOS technologies in general including CMOS and BiCMOS. Bipolar is less preferred.

The invention claimed is:

1. A comparator for comparing voltages of first and second inputs, comprising: first and second current paths coupled to the first and second inputs respectively, the first current path passing from the first input through a first main electrode and a second main electrode of a first transistor, and through a first bias current source to a supply line; the second current path passing through a reference voltage drop element, through a first main electrode and a second main electrode of a second transistor, and through a second bias current source to said supply line, the comparator further comprising a diode coupled to the first input to protect the first input from current flow through forward biasing of a parasitic diode from said second main electrode to a bulk of the first transistor.

2. The comparator of claim 1, further including circuitry coupled between the first main electrode and control electrode of the second transistor arranged to limit overvoltage.

3. The comparator of claim 2, wherein the first and second transistors are PMOS transistors.

4. The comparator of claim 1, wherein control electrodes of the first and second transistors are coupled together.

5. The comparator of claim 1, wherein the second main electrodes of the first and second transistors are coupled to the first and second bias current sources respectively, and the first input being coupled to the first main electrode of the first transistor.

6. The comparator of claim 5, wherein the second input is coupled to an electrode of the reference voltage drop element.

7. The comparator of claim 1, wherein a control electrode and the second main electrode of the first transistor are coupled together.

8. The comparator of claim 1, wherein an output is taken from the second main electrode of the second transistor.

9. The comparator of claim 1, further including a third transistor in the first current path and coupled to the second main electrode of the first transistor and the positive electrode of said first bias current source to limit overvoltage at the positive electrode of said first bias current source, and a fourth transistor in the second current path and coupled to the second main electrode of the second transistor and the positive electrode of said second bias current source to limit overvoltage at the positive electrode of said second bias current source.

10. An integrated circuit comprising the comparator of claim 1.

11. A battery powered mobile device comprising the integrated circuit of claim 10.

* * * * *